United States Patent [19]

Yamanaka

[11] Patent Number: 5,249,035
[45] Date of Patent: Sep. 28, 1993

[54] METHOD OF MEASURING THREE DIMENSIONAL SHAPE

[75] Inventor: Kazuyuki Yamanaka, Fujisawa, Japan

[73] Assignee: Kabushiki Kaisha Toshiba, Kawasaki, Japan

[21] Appl. No.: 797,725

[22] Filed: Nov. 25, 1991

[30] Foreign Application Priority Data

Nov. 26, 1990 [JP] Japan ................... 2-321921

[51] Int. Cl.$^5$ .............. G01B 11/24; H04N 7/18
[52] U.S. Cl. ................. 356/376; 358/106; 358/107; 382/8
[58] Field of Search ......... 356/375, 376, 394, 327, 356/2, 12; 382/1, 8, 22; 358/88, 107, 55, 101, 106; 250/558, 561

[56] References Cited

U.S. PATENT DOCUMENTS 3,726,591 4/1973 Helava et al. ............. 356/2
4,654,872 3/1987 Hisano et al. ............. 356/2
4,982,438 1/1991 Usami et al. ............ 356/376

FOREIGN PATENT DOCUMENTS 1-251630 10/1989 Japan.

Primary Examiner—Richard A. Rosenberger
Assistant Examiner—Hoa Q. Pham
Attorney, Agent, or Firm—Foley & Lardner

[57] ABSTRACT

To eliminate complicated adjustment of the mutual positional relationships between cameras and an object to be measured in the method of measuring a three dimensional shape of an object, images of an object to be measured are taken from different directions by use of three or more imaging devices; a combination of at least two imaging devices is selected in such a way that an angle between an obtained object image and an epipolar line becomes close to a right angle; and image information generated by the selected imaging devices are used as measuring image information. The method is particularly suitable when line-shaped objects extending in various directions are automatically measured three-dimensionally.

2 Claims, 5 Drawing Sheets

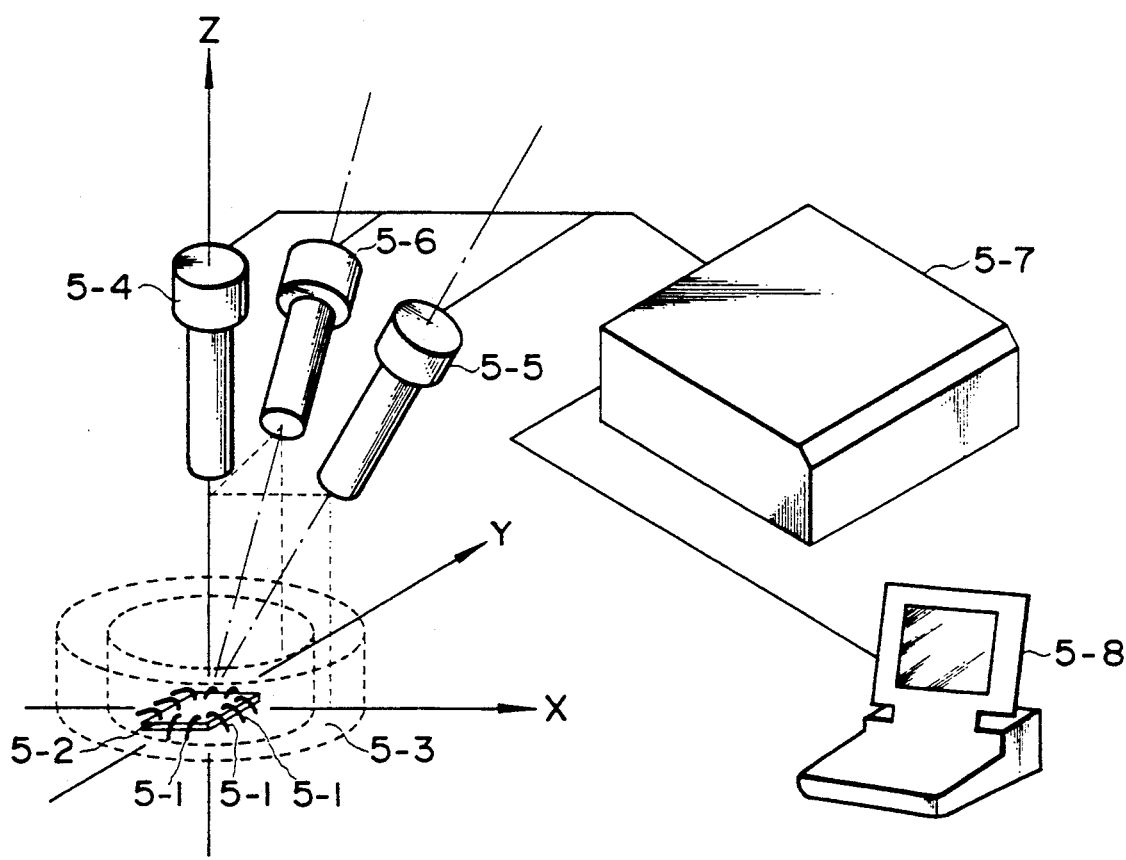
F I G. 5

METHOD OF MEASURING THREE DIMENSIONAL SHAPE

BACKGROUND OF THE INVENTION

The present invention relates to a method of measuring a three-dimensional shape of an object on the basis of image recognition, and more specifically to a three-dimensional measuring method suitable for use in measuring line-shaped objects such as bonded wires, for instance, arranged in any given direction.

When a three-dimensional shape is measured on the basis of image recognition, a method referred to as a stereoscopic view is adopted in general. In this method, as shown in FIG. 1, images of an object 1-1 in a three-dimensional space are taken by two cameras 1-11 and 1-12, and the three-dimensional coordinates are obtained on the basis of two-dimensional positions on both the image planes taken by the cameras. In FIG. 1, P1-11 and P1-12 denote images obtained by these two cameras 1-11 and 1-12.

In this method, when an object 1-1 to be measured is a point as shown in FIG. 1, it is possible to deduce the three-dimensional position in a space by relatively simply obtaining two-dimensional positions on both the image planes. However, when an object 2-1 is a line in shape as shown in FIG. 2, it is not easy to deduce the three-dimensional position of the line-shaped object 2-1 because it is difficult to determine the same points of the object 2-1 on the respective image planes.

To overcome this problem, a method of using an epipolar line has been known. This epipolar line object is a line obtained when a line of sight 3-1 through 1-1 along which the one camera 1-12 is seeing object 1-1 is imaginarily taken by the other camera 1-11, as shown in FIG. 3, which can be obtained as an epipolar line 3-2 on an image plane P1-11 of the camera 1-11. That is, since the object 1-1 exists on the line of sight 3-1 and further the epipolar line 3-2 is the line obtained by taking an image of the line of sight 3-1 with the camera 1-11, this epipolar line 3-2 indicates that an image of the object 1-1 exists always on this epipolar line 3-2 on the image plane P1-11 of the camera 1-11. By application of this epipolar line, when an object 4-1 to be taken is a line in shape, it is possible to determine that a point 4-2 on one image plane P1-12 and a point 4-3 on the other image plane P1-11 are the same point of the object 4-1, by determining the point 4-2 on the image of the object 4-1 on the image plane P1-12 of the camera 1-12, obtaining an epipolar line 3-2 corresponding to the line 3-1 of sight on the image plane P1-11 of the camera 1-11, and obtaining an intersection 4-3 between the image of the object 4-1 and the epipolar line 3-2 on the image plane P1-11 of the camera 1-11.

However, the inclination of this epipolar line 3-2 on the image plane P1-11 of the camera 1-11 is unconditionally determined on the basis of the positional relationship between the two cameras 1-11 and 1-12 and the point 4-2, without being subjected to the influence of the shape and direction of the object 4-1.

Consequently, when the intersection 4-3 is required with a high degree of precision, it is indispensable to adjust the mutual positional relationship between the cameras 1-11 and 1-12 and the object 4-1 so that the intersectional angle becomes as close to a right angle as possible. Therefore, when a line-shaped object extending in any given direction is required to be measured three-dimensionally, the positional relationship between the cameras 1-11 and 1-12 and the object 4-1 must be adjusted, thus complicated processing is required to automatically measure line-shaped objects.

SUMMARY OF THE INVENTION

Accordingly, the object of the present invention is to provide a method of measuring a three-dimensional shape of a line-shaped object without need of any complicated adjustment of a mutual positional relationship between cameras and objects, which is suitable in constructing a simple automatic measuring instrument.

According to the present invention, there is provided a method of measuring a three-dimensional shape, comprising the steps of taking images of an object to be measured from different directions by use of three or more imaging devices, selecting a combination of at least two imaging devices in such a way that an angle between an obtained object image and an epipolar line becomes close to a right angle; and using image information generated by the selected imaging devices as measuring image information.

According to the present invention, three or more imaging devices for taking images of an object to be measured in different directions, respectively are prepared; a combination of at least two imaging devices is selected so that an angle between an obtained object image and an epipolar line becomes close to a right angle; and the image information generated by the selected imaging devices is used. Therefore, it is possible to measure the three-dimensional shape of an object with a high degree of precision, without need of any complicated adjusting work of the imaging devices with respect to the object.

BRIEF DESCRIPTION OF THE DRAWINGS

In the attached drawings,

FIG. 5 is a schematic diagram showing an apparatus for realizing a three-dimensional measuring method related to one embodiment of the present invention;

DETAILED DESCRIPTION OF THE PREFERRED EMBODIMENTS

An embodiment of the present invention will be described hereinbelow with reference to the attached drawings.

FIG. 5 shows the construction of a measuring instrument for realizing the three-dimensional shape measuring method related to one embodiment of the present invention.

In FIG. 5, wires 5-1 are bonded to an LSI chip 5-2, and the wires 5-1 and chip 5-2 are both illuminated by an illuminating device 5-3 formed into an annular shape. When the wires 5-1 are measured, the LSI chip 5-2 is housed within this annular illuminating device 5-3 so that the chip can be illuminated uniformly from the peripheral direction all over the surfaces thereof to reflect light from the wires 5-1 at a high contrast, as compared with those at areas other than the wires.

Over the illuminating device 5-3, there are disposed three cameras 5-4, 5-5 and 5-6 to take images of the wires 5-1 and the LSI chip 5-2 from different directions. That is, when seen from the negative direction to the positive direction along the Y axis, the camera 5-4 is disposed just over the chip 5-2; the camera 5-5 is disposed obliquely on the right side; and the camera 5-6 is disposed obliquely on the rear side, so that the wire images can be taken from three different directions, respectively.

Figure 1:
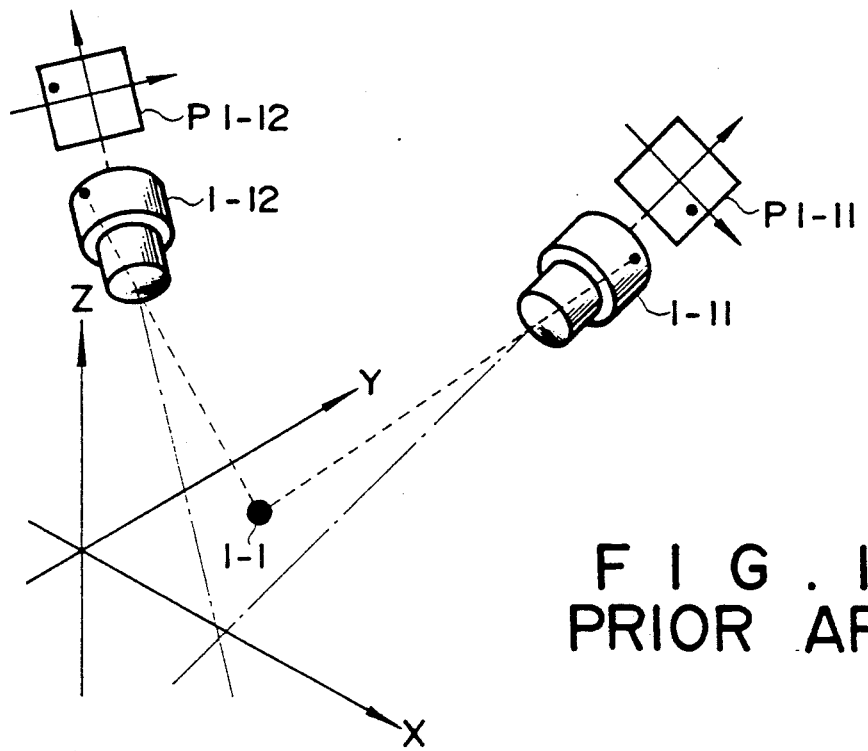
FIG. 1 is an illustration for assistance in explaining the principle of prior art three-dimensional measurement for a point object.
Figure 2:
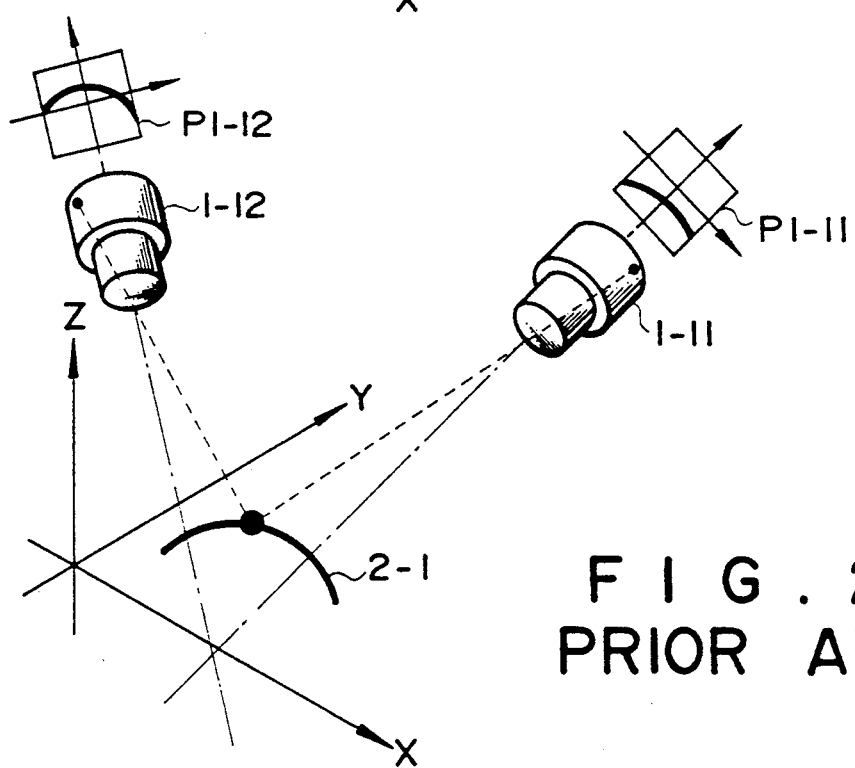
FIG. 2 is an illustration for assistance in explaining the principle of the same prior art method for a line-shaped object.
Figure 3:
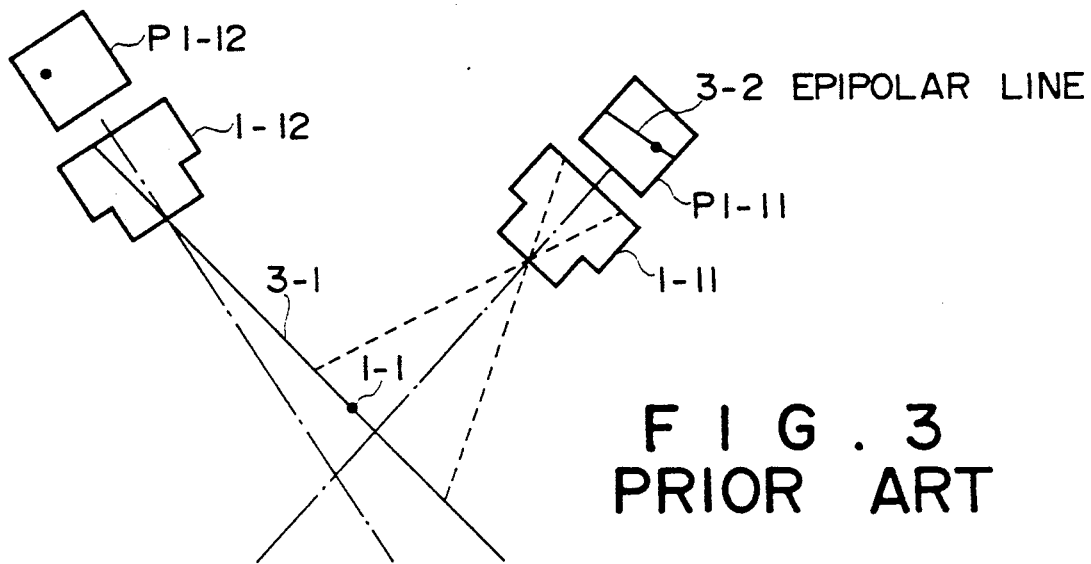
FIGS. 3 and 4 are illustrations for assistance in explaining the concept of an epipolar line.
Figure 4:
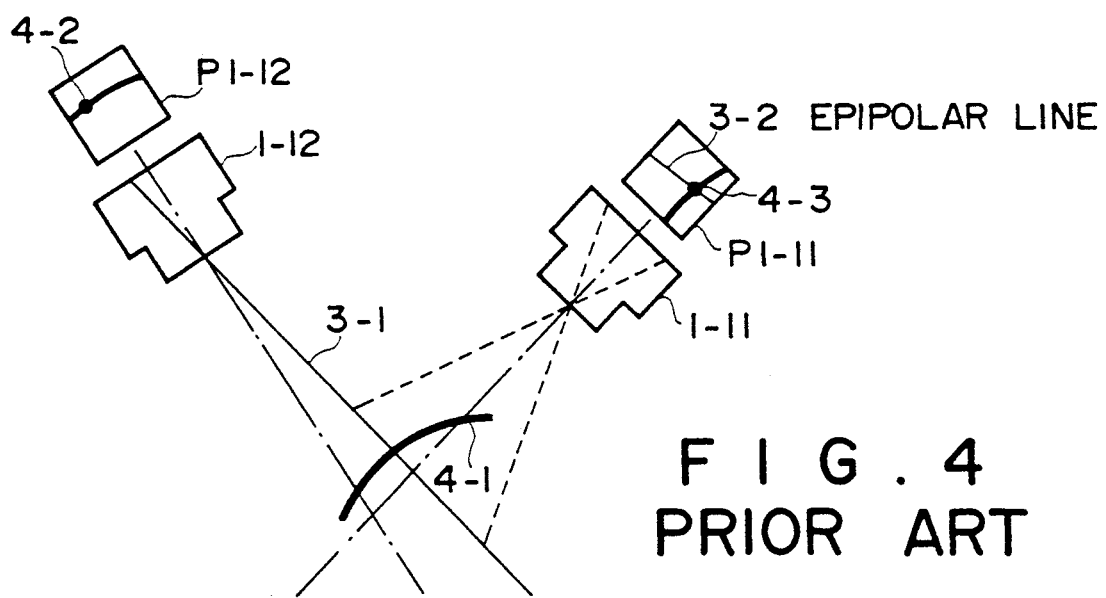
Figure 6A:
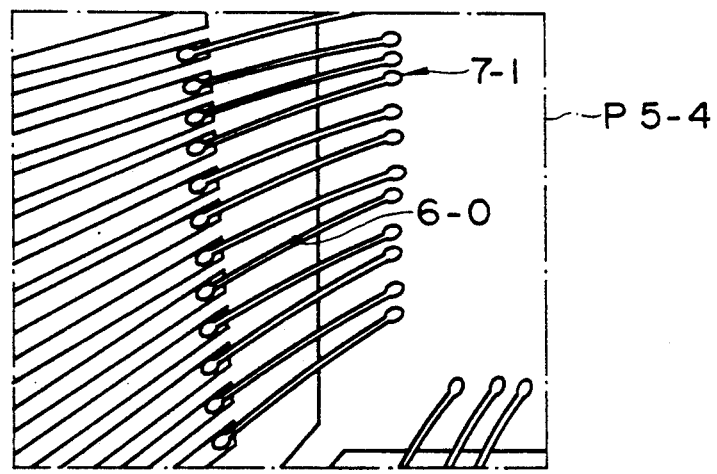
FIGS. 6A to 6C are illustrations for assistance in explaining the directional relationship between an epipolar line and a wire on camera image planes, on the basis of which two cameras are selected from three cameras.
Figure 6B:
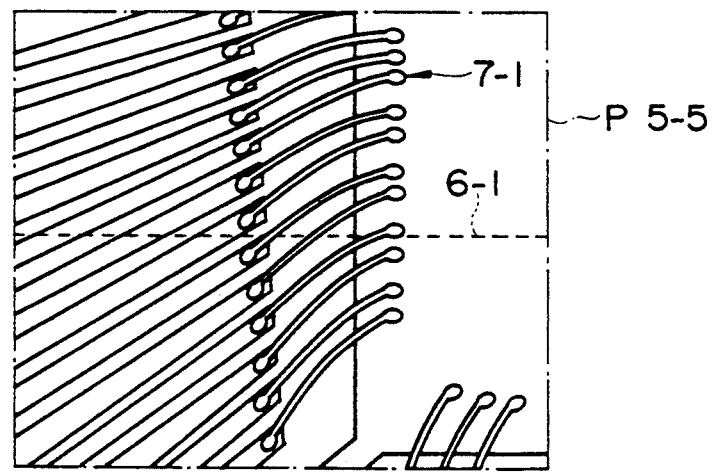
Figure 6C:
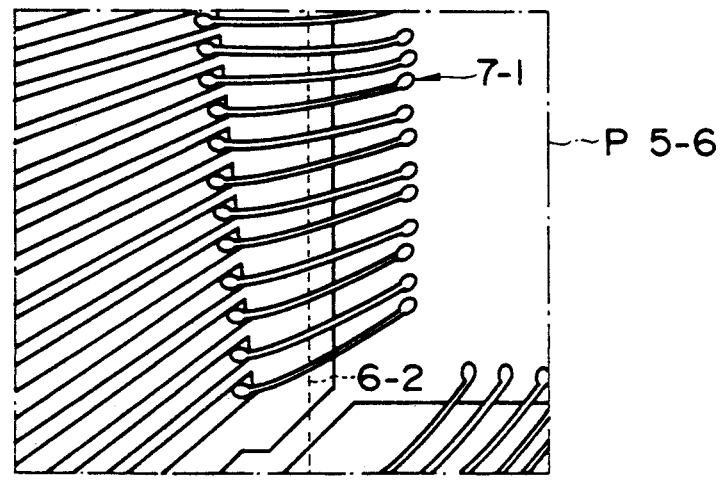

FIG. 6A to 6C show images obtained by the respective cameras 5-4 to 5-6, in which P5-4 is an image plane taken by the camera 5-4; P5-5 is that taken by the camera 5-5; and P5-6 is that taken by the camera 5-6, respectively. According to the above-mentioned positional relationship between these cameras 5-4 to 5-6, an epipolar line 6-1 on the image plane P5-5 obtained on the basis of any given point (e.g. 6 0) on the image plane P5-4 intersects at roughly right angles an epipolar line 6-2 on the image plane P5-6 obtained on the basis of the same point (e.g. 6-0) on the image plane 5-4.

With reference to FIG. 5 again, video signals generated by the three cameras 5-4 to 5-6 are supplied to an image processing unit 5-7. Under control of a host computer 5-8, the image processing unit 5-7 receives video signals from the cameras 5-4 to 5-6 and calculates two-dimensional coordinate information on the respective image planes 5-4 to 5-6. The two-dimensional shape of each wire in the respective image planes can be determined on the basis of the calculated two-dimensional coordinate information.

In response to the two-dimensional coordinate information, the host computer 5-8 handles each of a plurality of wires as a wire to be measured, and first detects the direction of each wire to be measured or inspected. The above-mentioned operation will be explained hereinbelow by taking a wire 7-1 as an object to be measured, by way of example.

First, the host computer 5-8 recognizes an approximate direction of the wire 7-1 on the basis of the coordinates of both ends of the wire 7-1, which can be obtained by use of the two-dimensional coordinate information on the image plane P5-4 calculated in response to video signals generated by the camera 5-4. On the basis of the recognized direction of the wire 7-1, the host computer 5-8 discriminates whether a combination of the cameras 5-4 and 5-5 or that of cameras 5-4 and 5-6 is appropriate with respect to the relationship between the inclinations of the epipolar lines 6-1 and 6-2 and the direction of the wire 7-1, respectively. The criterion is to check which one of two intersection angles between the epipolar line 6-1 and the wire 7-1 and between the epipolar line 6-2 and the wire 7-1 is closer to a right angle. In the case of the wire 7-1, therefore, the combination of two cameras 5-4 and 5-6 is determined as being appropriate. The host computer 5-8 transmits the discriminated result to the image processing unit 5-7 so that video signals generated by the camera 5-6 are supplied to the unit 5-7, in addition to the video signals from the camera 5-4.

Figure 7A:
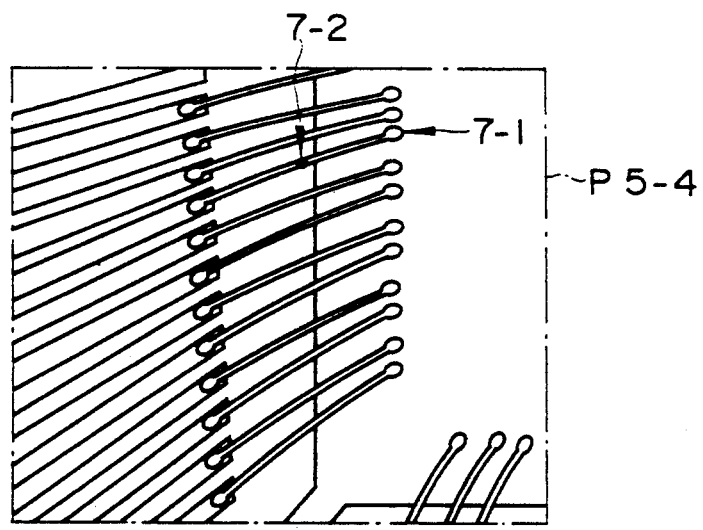
FIGS. 7A to 7C are illustrations for assistance in explaining the measuring procedure on the image planes of the selected cameras.

Thereafter, the image processing unit 5-7 first recognizes an image of the wire 7-1 on the image plane P5-4 of the camera 5-4, decides one point (e.g. 7-2) on the image of the wire 7-1 (FIG. 7A), and transmits its coordinate information to the host computer 5-8.

Figure 7B:
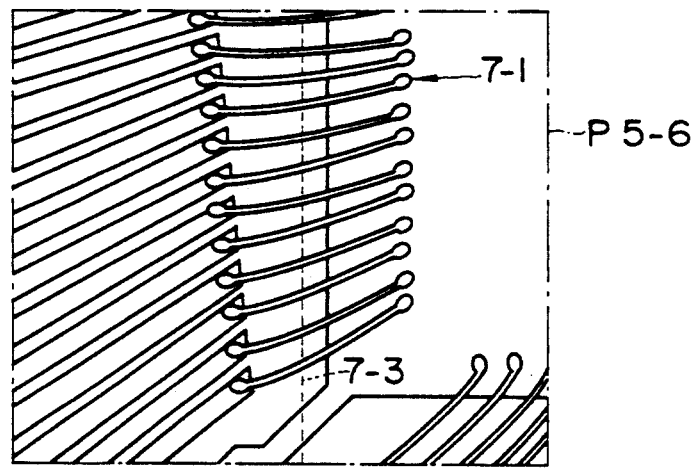

The host computer 5-8 calculates an epipolar line 7-3 on the image plane P5 6 of the camera 5-6 (FIG. 7B), which corresponds to the point 7-2, on the basis of the positional and directional relationship between the respective camera 5-4, 5-5 and 5-6 previously corrected as described already. An equation of the calculated epipolar line 7-3 expressed in a coordinate system of the image plane P5-6 is transmitted to the image processing unit 5-7.

Figure 7C:
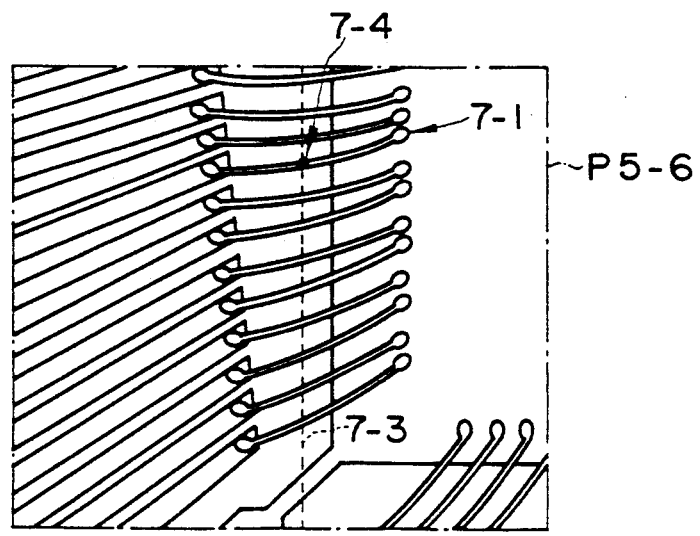

The image processing unit 5-7 calculates the coordinates of the intersection point 7-4 between the epipolar line 7-3 and the wire 7-1 (FIG. 7C), and transmits the calculated coordinates to the host computer 5-8.

Accordingly, the host computer 5-8 can know two-dimensional coordinates of the point 7-2 on the wire 7-1 on both the image planes P5-4 and P5-6, so that it is possible to calculate the three-dimensional coordinates on the basis of these coordinates.

The above-mentioned processing is repeated at various points on the wire 7-1 to measure a locus of the wire 7-1 as a series of a finite number of separated points.

Similar processing is repeated to measure the shapes of other wires to be detected.

In the above-mentioned embodiment, since the positional relationship among cameras 5-4, 5-5 and 5-6 is previously determined in such a way that the epipolar line 6-1 on the image plane P5-5 obtained on the basis of any given point (e.g. 6-0) on the image plane P5-4 and the epipolar line 6-2 on the image plane P5-6 obtained on the basis of any given point 6-0 on the image plane 5-4 extend in the respective directions so as to intersect each other at a right angle, it is possible to secure the intersection angle between the wire and each epipolar line of about 45 degrees at the worst.

As described above, according to the present invention, since three cameras 5-4, 5-5 and 5-6 arranged in three different image directions, respectively are prepared and further a combination of two cameras is selected in such a way that the intersection angle between the epipolar line and an object to be measured becomes close to a right angle, it is possible to measure the three-dimensional shape of an object with a high degree of precision without performing complicated camera position adjusting work.

Only one embodiment has been explained by way of example. Without being limited thereto, the invention including the following modifications.

(1) In the above embodiment, the general direction of a line-shaped object (e.g. wire) has been recognized on the basis of the two-dimensional coordinates of both end portions thereof. In some cases, however, it is preferable to recognize the direction of one line-shaped object within a limited area thereof.

In more detail, where the overall shape of an object is roughly uniform extending in a straight direction as with the case of the above-mentioned wire 7-1, it is possible to measure the overall areas of the object without involving any problems, by recognizing the direction thereof on the basis of the coordinates of both the ends thereof and using video signal information obtained by cameras selected on the basis of the recognized direction. However, where the overall shape of an object (e.g. stapler needle) is not uniform but bent, the direction of the intermediate portion is different from those of both the end portions. In this case, therefore, it is preferable to select two points at a limited area near the area to be measured, respectively in order to recognize the directions of the object.

(2) Furthermore, in the above embodiment, the coordinates of both ends of an object to be measured have been recognized on the basis of video signal information of cameras in order to determine the direction of the object. However, it is also possible to previously store two-dimensional coordinates of both the ends of an object to be measured in the host computer by use of already known data.

In this case, however, the procedure of receiving video signals from the cameras is different from that of the above-mentioned embodiment. In more detail, in the above-mentioned embodiment, video signals of the camera 5-4 are first received, and then the direction of an object is determined on the basis of the received information. In other words, video signals of the camera 5-4 have been already received, at the stage where the object is determined. Therefore, the processing is executed in such a way that video signals of the other camera 5-6 combined with the camera 5-4 are received, after the object direction has been determined.

However, where data used for determining the object direction are previously stored in the host computer 5-8, the image processing unit 5-7 does not receive any video signals from the cameras at the stage where only the object direction has been determined. Therefore, after the object direction has been determined and therefore the camera combination has been decided, the host computer 5-8 informs the image processing unit 5-7 of the determined results. For instance, if the two cameras 5-4 and 5-6 are combined as in the above-mentioned embodiment, the host computer 5-8 transmits a command to the image processing unit 5-7 so as to receive video signals from both the cameras 5-4 and 5-7. That is, after the camera combination has been determined, video signals are transmitted from the cameras 5-4 and 5-6 to the image processing unit 5-7.

The data previously provided to the host computer 5-8 to determine the directions of objects to be measured are, for instance, coordinate data of the start and end points of a wire bonder and coordinate data of the pellet pad positions and inner lead bonding positions, in the case where the object to be measured is a bonded wire.

(3) In the above-mentioned embodiment, the object to be measured is bonded wires. Without being limited thereto. The present invention is of course applicable to measure various line-shaped objects such as outer leads of a package. In addition, the invention is applicable to measure various objects not directly related to semiconductor devices.

(4) The number of necessary cameras is at least three. Therefore, additional cameras can be arranged according to the necessity. In the above-mentioned embodiment, three cameras are disposed to use two cameras thereamong. However, it is also possible to dispose four or more cameras to use three or more cameras for providing a higher degree of measurement precision. When three cameras are used, two cameras A and B of the three cameras A, B and C are used for measurement as with the case of the above-mentioned embodiment, and the remaining camera C is used to check whether the measured result is correct or not.

Here, the assumption is made that as a result of the fact that an epipolar line has been obtained with the camera B on the basis of the line of sight of the camera A, there exists two doubtful points. In this case, when two epipolar lines are obtained from the camera A to the camera C and from the camera B to the camera C to obtain an intersection between two points, it is possible to deduce the same point of view of both the cameras A and B by confirming the obtained intersection.

As described above, in the measurement method according to the present invention, since three or more imaging devices are prepared to take images of an object to be measured from different directions, it is possible to select a combination of at least two imaging devices by which an angle between the epipolar line and the object to be measured is closer to a right angle, thus enabling a high degree of precision in measurement of the three dimensional shape of an object, without requiring complicated positional adjustment of the imaging devices with respect to the object.

What is claimed is:

1. A method of measuring a three-dimensional shape of an object by imaging devices using epipolar lines projected on image planes of said imaging devices, comprising the steps of:

taking images of said object by at least first, second and third imaging devices from different viewpoints and projecting said images on respective image planes of said imaging devices;

calculating two-dimensional coordinate information with respect to said images on each of said image planes to detect a direction of an image of said object on each of said image planes;

selecting one combination of said imaging devices of at least a combination of said first and third imaging devices and a combination of said second and third imaging devices by checking, using said direction, to determine which one of two angles, one angle being between a first image on a first image plane of said first imaging device and a first epipolar line on said first image plane with respect to said third imaging device and another angle being between a second image on a second image plane of said second imaging device and a second epipolar line on said second image plane with respect to said third imaging device, is closer to a right angle; and measuring said three-dimensional shape of said object by using said one combination of said imaging devices selected in said selecting step.

2. A method according to claim 1, further comprising the step of detecting two epipolar lines on said second image plane with respect to said first and said third imaging devices, if a combination of said first and said third imaging devices is selected, to obtain an intersection between said two epipolar lines, and determining the same point of view from both said first and said third imaging devices with respect to said object.

* * * * *